United States Patent
Mei (10) Patent No.: US 7,932,993 B2
(45) Date of Patent: Apr. 26, 2011

(54) DIVIDED SUB-IMAGE ARRAY SCANNING AND EXPOSING SYSTEM

(76) Inventor: Wenhui Mei, Plano, TX (US)

(*) Notice: Subject to any disclaimer, the term of this patent is extended or adjusted under 35 U.S.C. 154(b) by 552 days.

(21) Appl. No.: 11/522,215

(22) Filed: Sep. 16, 2006

(65) Prior Publication Data
US 2008/0180648 A1    Jul. 31, 2008

(51) Int. Cl.
G03B 27/42    (2006.01)
(52) U.S. Cl. ............................................. 355/53; 349/29
(58) Field of Classification Search .................... 355/53; 349/29; 359/619
See application file for complete search history.

(56) References Cited

U.S. PATENT DOCUMENTS

| | | | |
|---|---|---|---|
| 4,744,047 A | 5/1988 | Okamoto et al. | |
| 5,281,996 A | 1/1994 | Bruning et al. | |
| 5,602,620 A | 2/1997 | Miyazaki et al. | |
| 5,691,541 A | 11/1997 | Ceglio et al. | |
| 5,870,176 A | 2/1999 | Sweatt et al. | |
| 5,900,637 A | 5/1999 | Smith | |
| 5,909,658 A | 6/1999 | Clarke et al. | |
| 5,955,776 A | 9/1999 | Ishikawa | |
| 5,998,069 A | 12/1999 | Cutter et al. | |
| 6,084,656 A | 7/2000 | Choi et al. | |
| 6,133,986 A * | 10/2000 | Johnson | 355/67 |
| 6,177,980 B1 | 1/2001 | Johnson | |
| 6,379,867 B1 | 4/2002 | Mei et al. | |
| 6,424,404 B1 | 7/2002 | Johnson | |
| 6,842,290 B2 | 1/2005 | Liang et al. | |
| 2002/0021426 A1* | 2/2002 | Mei et al. | 355/53 |
| 2002/0159044 A1* | 10/2002 | Mei et al. | 355/67 |
| 2005/0024477 A1* | 2/2005 | Noguchi et al. | 347/241 |
| 2006/0139597 A1* | 6/2006 | Lof et al. | 355/55 |
| 2006/0158467 A1* | 7/2006 | Larson et al. | 345/694 |

* cited by examiner

Primary Examiner — Edward J Glick
Assistant Examiner — Mesfin T Asfaw (57) ABSTRACT

An "image writing" and "image reading" system and method for providing a pattern to a subject such as a wafer is provided or an image to an image sensor such as CCD. The system includes a pixel panel, such as a digital mirror device or a liquid crystal display or other SLM, for generating for creating a plurality of sub-image array of the pattern in "image writing" case. The pixel elements are simultaneously divided to a sub-image array on the subject by a lens system. The system also includes a stage for moving, stepping or scanning the pixel panel, relative to the subject so that it can create a contiguous whole image on the subject.

20 Claims, 8 Drawing Sheets

DIVIDED SUB-IMAGE ARRAY SCANNING AND EXPOSING SYSTEM

BACKGROUND OF INVENTION

The invention relates to two fields that can be broadly categorized as "image writing" and "image reading". The invention's primary intended application for image writing would be as a microlithography printer for semiconductor manufacture, PCB and LCD manufacture; however this field may also include applications such as document printing, photographic reproduction, etc. Its primary intended application in the image reading field would be as a high-resolution document scanner, although it could also potentially be used for other applications, for example as a scanning microscope with camera, or as a reader for optical mass storage media, etc. The following description will focus on the photographic exposure equipment and scanning system, and more particularly, to a photolithography system and method, such as can be used in the manufacture of semiconductor integrated circuit devices, although the specification can be applied by obvious extension to other applications as well.

The present invention relates generally to in conventional photolithography systems, the photographic equipment requires a mask for imaging a pattern onto a photo resist coated subject. The subject may include, for example, a semiconductor substrate for manufacture of integrated circuits, metal substrate for etched lead frame manufacture, conductive plate for printed circuit board manufacture, or the like. A patterned mask or photo mask may include, for example, a plurality of lines, structures, or images. With conventional photolithography, the patterned masks are typically very expensive. In addition, the photomasks are characterized as requiring a very long mask purchase lead time. The long mask purchase lead time is not very helpful when a short product development cycle is desired. Further, if a particular mask design is found to require a design change in the pattern, no matter how small of a then mask modification cost and a respective lead time to implement the required change can cause serious problems in the manufacture of the desired product.

In current maskless system, there are two method which are using in actual system. One is to use a directly reduced image of a spatial light modulator (SLM) or other device on substrate surface, another is point array method which uses a microlens or multi-microlens to get a focus point array of microlens focus plane on the substrate.

Direct reduced image method is simple but the image size on the substrate is very small and cause very slow productivity.

In point array approach, each of the plurality of pixel elements is then simultaneously focused to discrete, non-contiguous portions of the subject. The subject and pixel elements are then moved (e.g., by vibrating one or both of the subject and pixel elements) and the sub-pattern is changed responsive to the movement and responsive to the pixel-mask pattern. As a result, light can be projected into the sub-pattern to create the plurality of pixel elements on the subject, and the pixel elements can be moved and altered, according to the pixel-mask pattern, to create a contiguous image on the subject. It uses a very small micolens. There are advantages to using very small microlenses for such applications. For example, the microlenses' focusing resolution may be limited by chromatic dispersion and by the size of the illumination source (if an extended source such as an arc lamp is used), but the effect of these factors can be mitigated by using small microlenses. If the microlenses are sufficiently small these factors become insignificant and focusing resolution is dominated by diffraction. If the microlens material has significant optical absorption over the operating wavelength range, it would also be advantageous to use small microlenses in order to minimize the absorption loss. However, very small microlenses cannot easily be formed without incurring significant fill factor losses. The microfabrication processes may not be able to produce accurately profiled lens surfaces if the microlens apertures are closely juxtaposed. The structure supporting the microlenses can also take up some of space between microlenses (particularly if the structural material is not optically transparent and has open light transmission channels). Furthermore, if the microlens array is integrated with electronic or micromechanical components (e.g., surface proximity sensors or microlens focus actuators), the space required to accommodate these elements can also significantly limit the lens fill factor. Point array method need to align microlens with each pixel. Any error will cause significant cross talk and noise and lower the energy efficiency. Another disadvantage is depth of focus (DOF) which affects actual system performance. The DOF of point array method is depended on microlens numerical aperture (N.A.) rather than image itself, such as an image with very rough feature size has same DOF of microlens.

SUMMARY

The present invention has been devised in order to solve problems with the current technology described above, and an object of the present invention is to provide an optical system which can accurately project a divided sub-image array of a spatial light modulation on the substrate.

The invention provides imaging systems and techniques that circumvent the tradeoff between image resolution and field size which is the source of much of the complexity and expense of conventional microlithography systems. A technical advance is achieved by a novel system and method for photolithography which provides a digital image from a pixel panel onto specific sites on a subject. In one embodiment, the system includes a panel for generating the pattern and for creating a plurality of pixel elements. An image divider and reduction lenses are included in the system. It may be microlenses or other device such as fiber taper, Fresnel lens or magnetic lens. The function of image divider and reduction lenses is to form a divided sub-image array.

In order to achieve the object described above, an exposure device of a first aspect of the present invention includes: a light source which emits a light beam for exposure; a spatial light modulation device at which a plurality of modulation elements, which respectively change light modulation states thereof in accordance with control signals, are one or two-dimensionally arranged, the spatial light modulation device being for modulating the light beam, which is incident at the plurality of modulation elements from the light source, at each of the modulation elements; the microlens array set at which a plurality of microlenses are one or two-dimensionally arranged with a pitch corresponding to the plurality of sub-image size, The microlens set has at least two microlens arrays. The first microlens array set is for condensing light beams and the second microlens array is for shrinking sub-image size on the substrate, which have been modulated by the modulation elements, at the respective microlenses;

Each of the plurality of sub-image is then simultaneously focused to discrete, non-contiguous portions of the subject. The subject and sub-images are then moved relatively and the pattern on SLM is changed by computer data generating system responsive to the movement and responsive to the pixel-mask pattern. As a result, light can be projected into the pattern to create the plurality of sub-images on the subject, and the sub-images can be moved and altered, according to the pixel-mask pattern, to create a contiguous whole image on the subject.

In some embodiments, the method also removes noise light from each of the sub-image by passing through an aperture array on the field microlens array focus plane.

In some embodiments, the method also removes noise light from each of the sub-image by passing through a shadow mask on the image microlens array.

In some embodiments, the method also removes noise light from each of the sub-image by passing through a shadow mask on image plane of image microlens array.

In some embodiments, the step of focusing simultaneously creates a plurality of coplanar sub-image array on the subject. This can be accomplished, for example, through a microlense array or a fiber taper.

In some embodiments, the step of changing the pixels is accomplished by sequentially providing a plurality of bit maps. Each of the bit maps is used to create the patterns on SLM.

Therefore, an advantage of the present invention is that it eliminates or reduces the problems in the art associated with conventional masks.

Another advantage of the present invention is that it provides a lithographic system and method with increased resolution.

Still another advantage of the present invention is that it provides an improved photolithography system, such improvement being in DOF, SLM alignment requirement.

A further understanding of the nature and advantages of the present invention may be realized by reference to the remaining portions of the specification and the drawings.

DETAILED DESCRIPTION

The present disclosure relates to exposure systems, such as can be used in semiconductor photolithographic processing. It is understood, however, that the following disclosure provides many different embodiments, or examples, for implementing different features of one or more inventions. Specific examples of components and arrangements are described below to simplify the present disclosure. These are, of course, merely examples and are not intended to limit the invention from that described in the claims.

Figure 1:
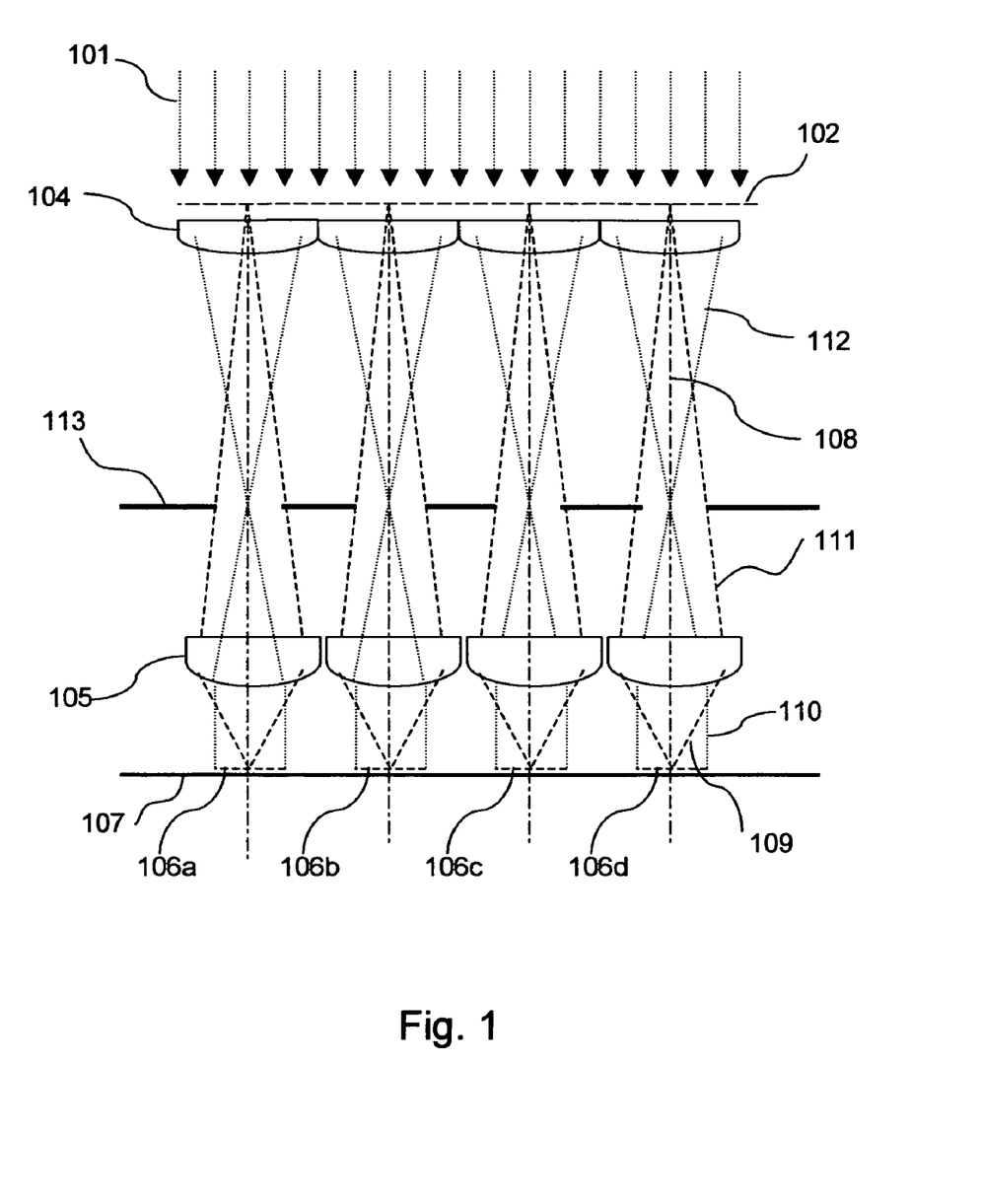
FIG. 1 illustrates the divided sub-image array optical system.
Figure 2:
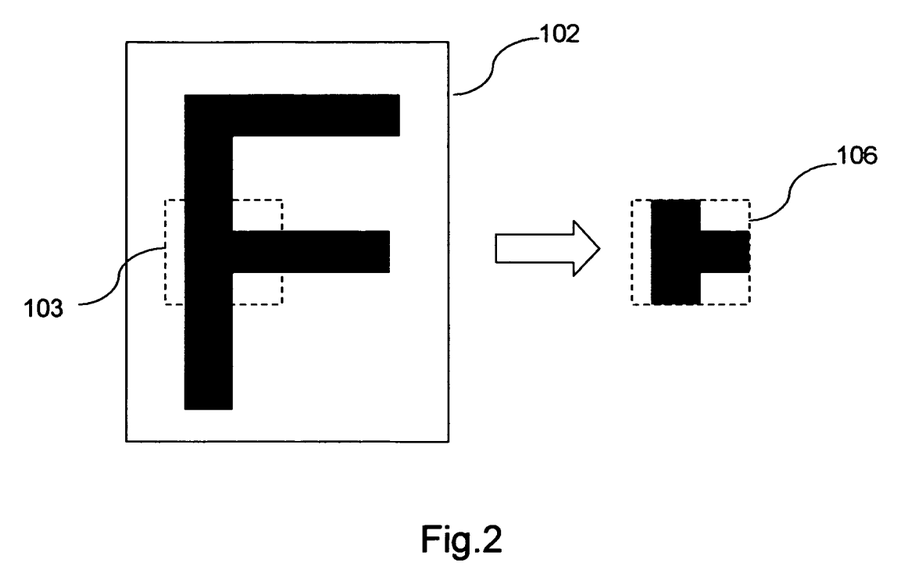
FIG. 2 illustrates a sub-image from an image.
Figure 3:
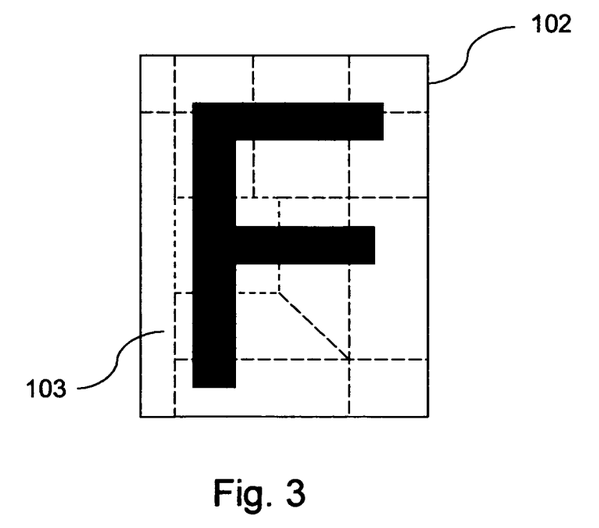
FIG. 3 illustrate various divided sub-images.

With reference now to FIG. 1, a divide sub-image array optical system includes a light source 101, a spatial light modulator (SLM) 102, a field microlens array 104, an aperture array 113, a shrinking image microlens array 105, a subject 107. A resist layer or coating may be disposed on the subject 107. The light source 101 provides a uniform light beam onto the SLM 102. The SLM 102 creates a desired pixel pattern (the pixel-mask pattern). The pixel-mask pattern may be available and resident at the SLM 102 for a desired, specific duration. Light emanating from (or through) the pixel-mask pattern of the SLM 102 then passes through the field microlenses array 104 and focus onto the aperture array 113. The aperture function is to reduce any noise light. It may not use in the actual system to reduce system cost. The light will pass through the second microlens array which shrinks each of sub-images on the substrate. In this manner, the pixel-mask pattern is projected onto the substrate of the subject 107. SLM 102, field microlens 104, aperture array 113, image microlens array 105 could be aligned each other with each optical axis. The subject 107 may be a wafer, such as is used in conventional fabrication of semiconductor integrated circuits. It is understood, however, that many different substrates can benefit from the present invention, including for further example, a nonflat substrate. It is desired to project a plurality of sub-images on the wafer 107 using the maskless photolithography system Referring now to FIG. 2, is to indicate a sub-images 102 from an image 102. A sub-image 106 is a portion of whole image 102. The area shape 103 may be square circle, triangle or any other shape which is decided by actual system design. In this sample, it is a square shape 103. FIG. 3 shows an image 102 is divided to several sub-images 103 in different shape. Each of sub-image should include at least four pixels.

Figure 4:
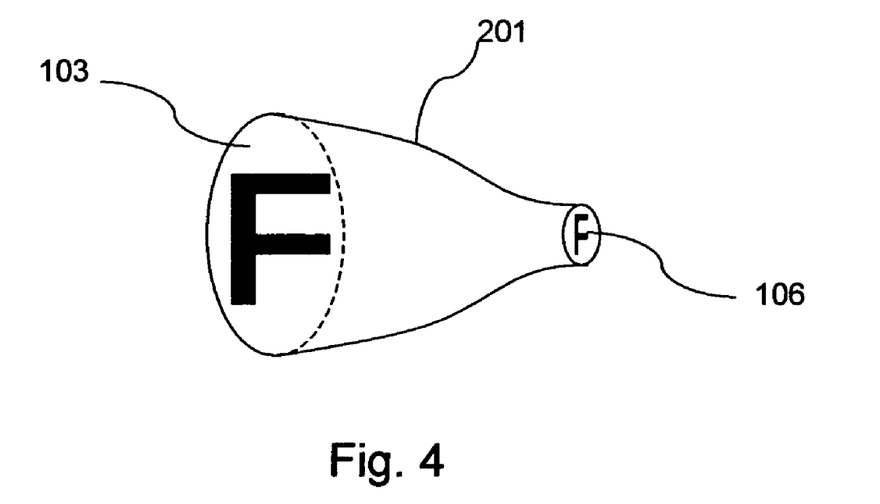
FIGS. 4~5 illustrate a fiber taper as the function of a divided sub-image array optical system.
Figure 5:
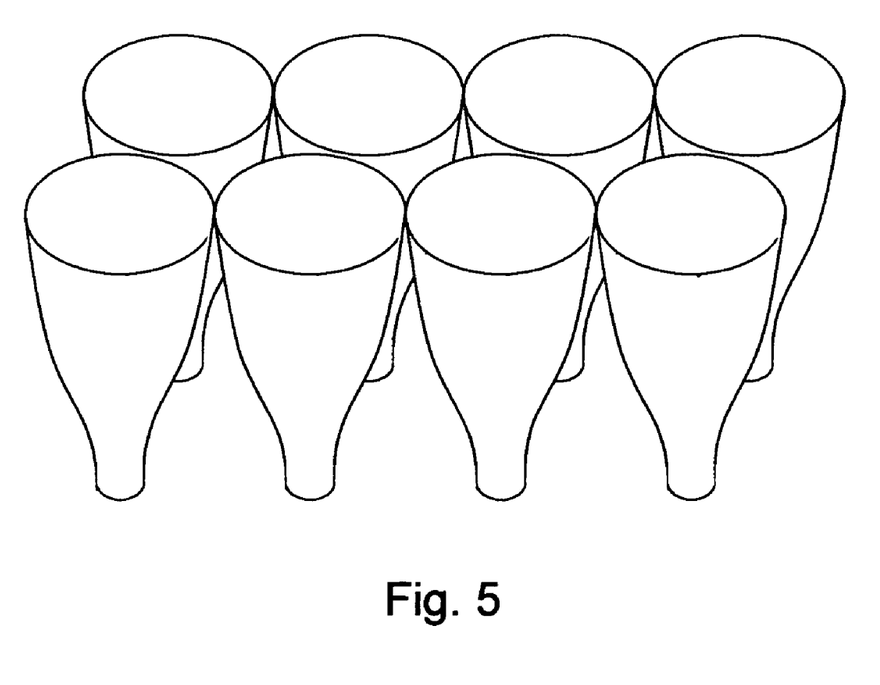

FIG. 4 and FIG. 5 show another approach to get a sub-image. It uses a fiber taper 201 which can directly reduce a image 103 to small size of image 106. The function is same as field microlens array plus image microlens array. A fiber taper 201 consists of a bundle of optical fibers which has a different size in both of ends. If an object is input on the big size end, an image will be on the small size end. The end of a fiber taper may be a round, square or other shape. A fiber taper array can be used to get a divided sub-image array which is same as microlens array case but the cost may be much higher than microlens array.

Figure 6:
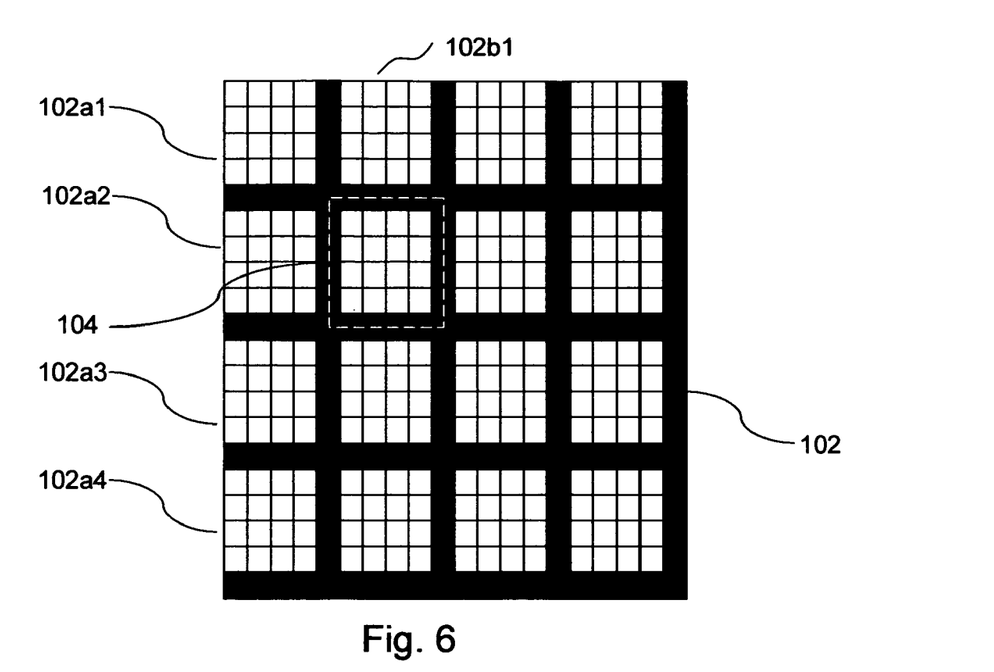
FIG. 6 is a sample view of a divided sub-image array and field lens position related with sub-image.

In the embodiment of FIG. 1, the image may like FIG. 6 after the light 101 passes through SLM 102 and the field microlens array 104. To reduce image aberrations, SLM 102 is close to field microlens array as much as possible. $102a1$, $102a2$, $102a3$, $102a4$, and $102b1$ are sub-images before shrinking. The microlens 104 totally covers 5×5 pixels in FIG. 6. The edge pixels may dummy for reducing cross-talk and noise. In the case, the microlens 104 is aligned within dummy pixel center rather than pixel edge. It will significantly lower the SLM and microlens alignment accuracy requirement and noise light but it reduces light efficiency in the system. When a sub-image 104 is a rectangle shape and considering that each sub-image has a length of l elements and a width of w elements, then the light loss can be determined as $$\text{Loss}=(w+l-1)/(w\times l) \tag{1}$$

From this equation, bigger w and l will reduce the light energy loss.

Figure 7:
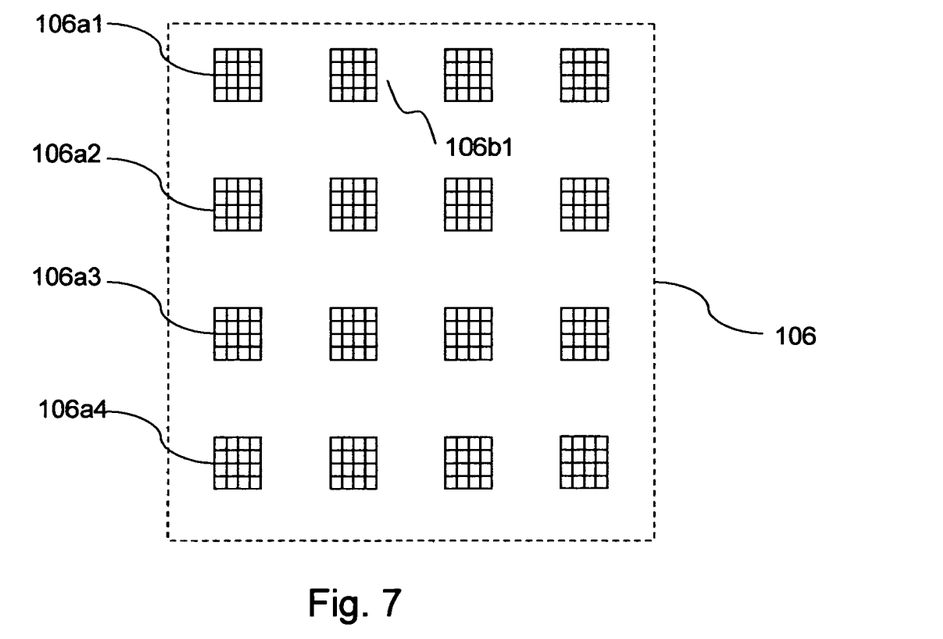
FIG. 7 is a sub-image array after shrinking microlens array.

Referring now to FIG. 7, the example of FIG. 6 can shrink to 4×4 effective pixels in a sub-image array. The edge pixels of the sub-image are dark for reducing noise light and alignment. It is obvious that the pixel size in FIG. 7 is much smaller than original size in FIG. 6. simultaneously moving, stepping or scanning the sub-image array relative to the subject so that a sub-image array can make a whole pattern on the subject.

Figure 8:
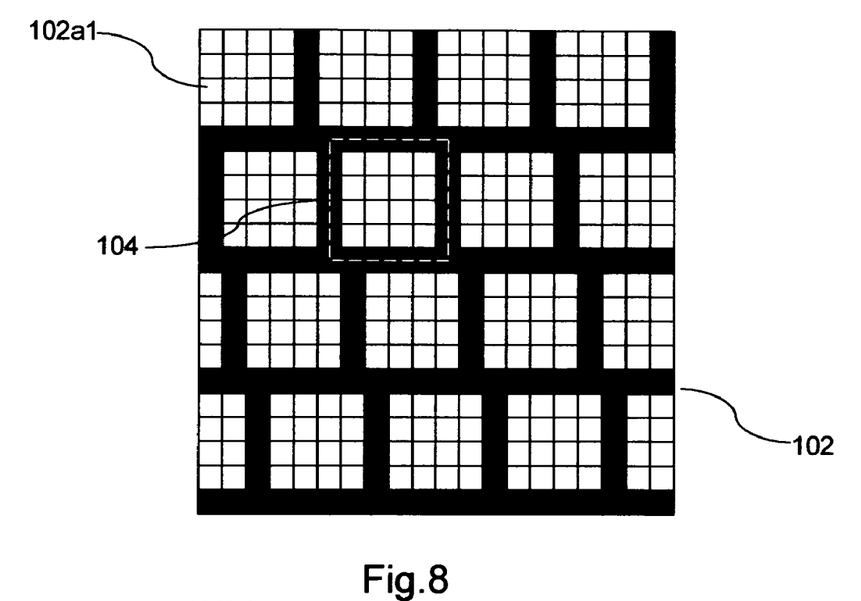
FIGS. 8~9 illustrate another embodiment of the present invention.
Figure 9:
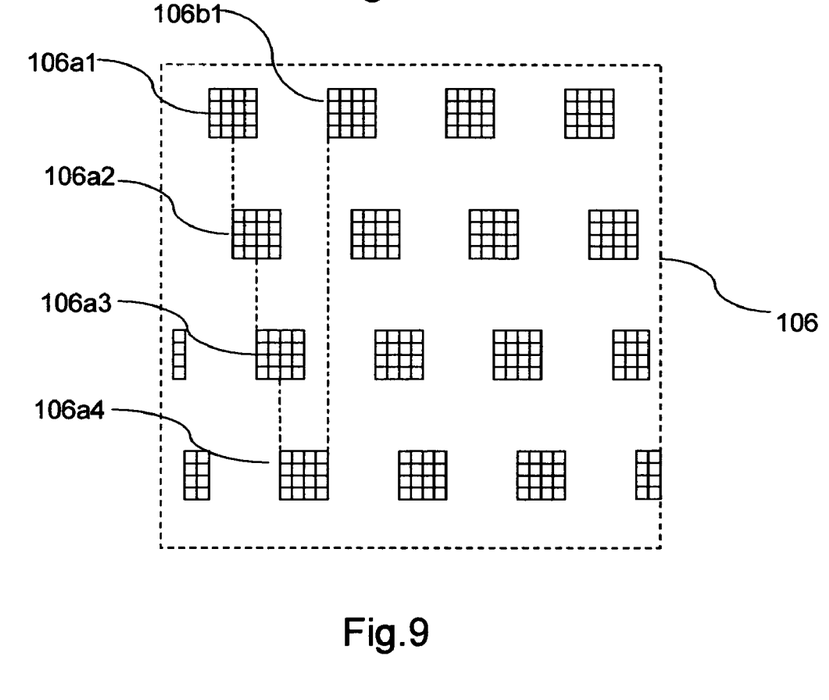
Figure 10:
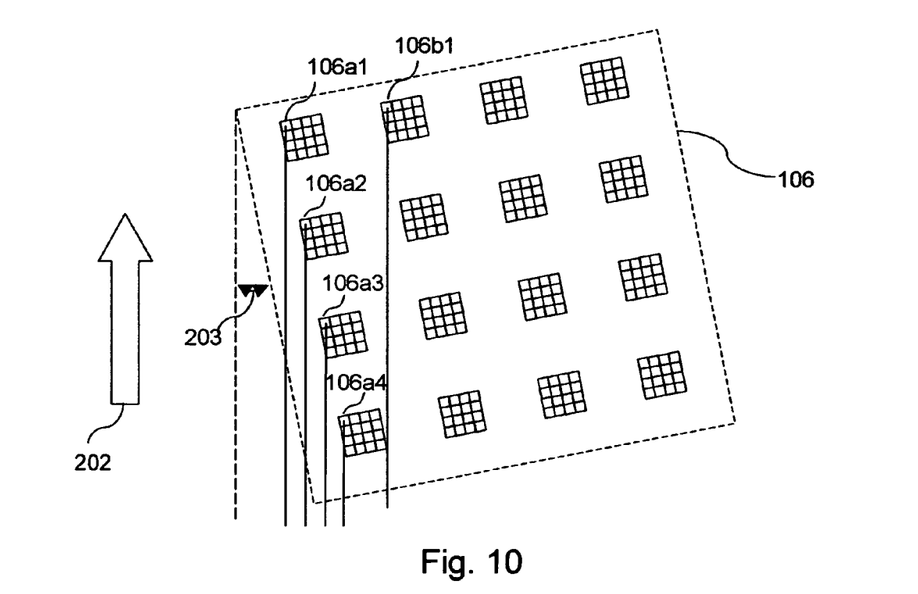
FIG. 10 is an embodiment of scanning exposure system of FIGS. 6~7.

FIG. 8 and FIG. 9 shows another embodiment to do scanning exposure without tilting sub-image 106 because each sub-image are not aligned within a line. For example, 106a2 is shifted two elements in right direction if assuming the shrinking ratio is the half of original size 102a1. Due to sub-image 106a1, 106a2, 106a3 and 106a4 are shifted two elements relatively in right direction and if scanning is in vertical direction, the sub-image array is not necessary to tilt like FIG. 10 case. Because the sub-image is not tilted, the computing of image data may be easier than FIG. 10 case. FIG. 10 shows a scanning case of FIG. 7. In FIG. 10, there is a tilt angle 203. each element will make a line in scanning direction 202.

Figure 11:
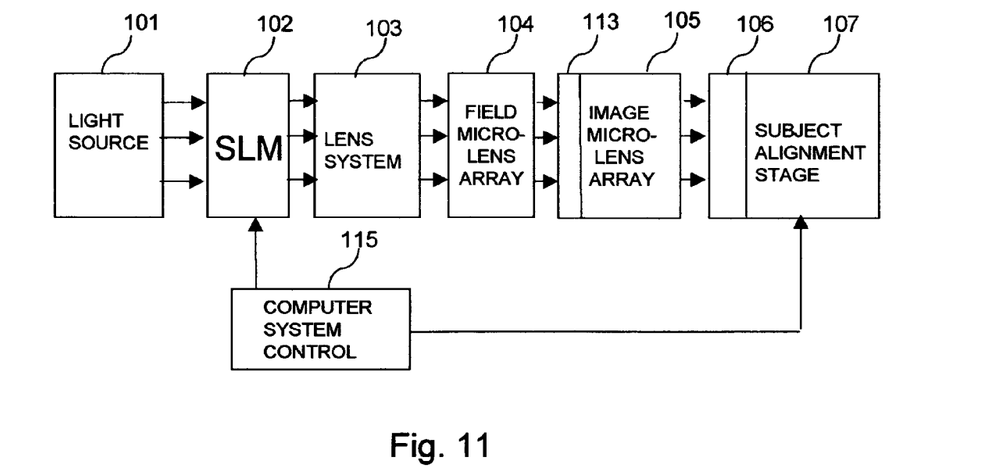
FIG. 11 illustrates a maskless photolithography system including a pattern generator and mask pattern design system according to one embodiment of the present invention.

With reference now to FIG. 11, the maskless photolithography system of the present disclosure includes a light source 101, a computer pattern generating and system control unit 115, a SLM 102, a lens system 103, a field microlens array 104, a aperture array 113, a image microlens array 105, a subject 106 and stage 107. A resist layer or coating may be disposed on the subject 106. The light source 101 is a uniform beam of light which is projected onto the SLM 102. The SLM 102 is provided with digital data via suitable signal line(s) from the computer pattern generating and control system 115 to create a desired pixel pattern (the pixel-mask pattern). The pixel-mask pattern may be available and resident at the SLM 102 for a desired, specific duration. Light emanating from (or through) the pixel-mask pattern of the SLM 102 then passes through the lenses system 103 and onto the field microlens array surface 104. The field microlens focuses the light to the focus plane 113. An aperture array may be put on the focus plane 113 to remove some of noise light. Then the light reaches image microlens array which shrinks the sub-image. A subject 106 is on the image microlens array's image plane so the pixel images of SLM 102 are on the subject 106. The subject may be stepped, scanned or rotated by the stage 107 which is controlled by computer system 115. In this manner, the pixel-mask pattern is projected onto the resist coating of the subject 106. Any modifications and/or changes required in the pixel-mask pattern can be made using the computer data generating and control system 115. As a result, the need for fabrication of a new patterned printed mask, as would be required in conventional photolithography systems, is eliminated by the photolithography system of the present disclosure.

Figure 12:
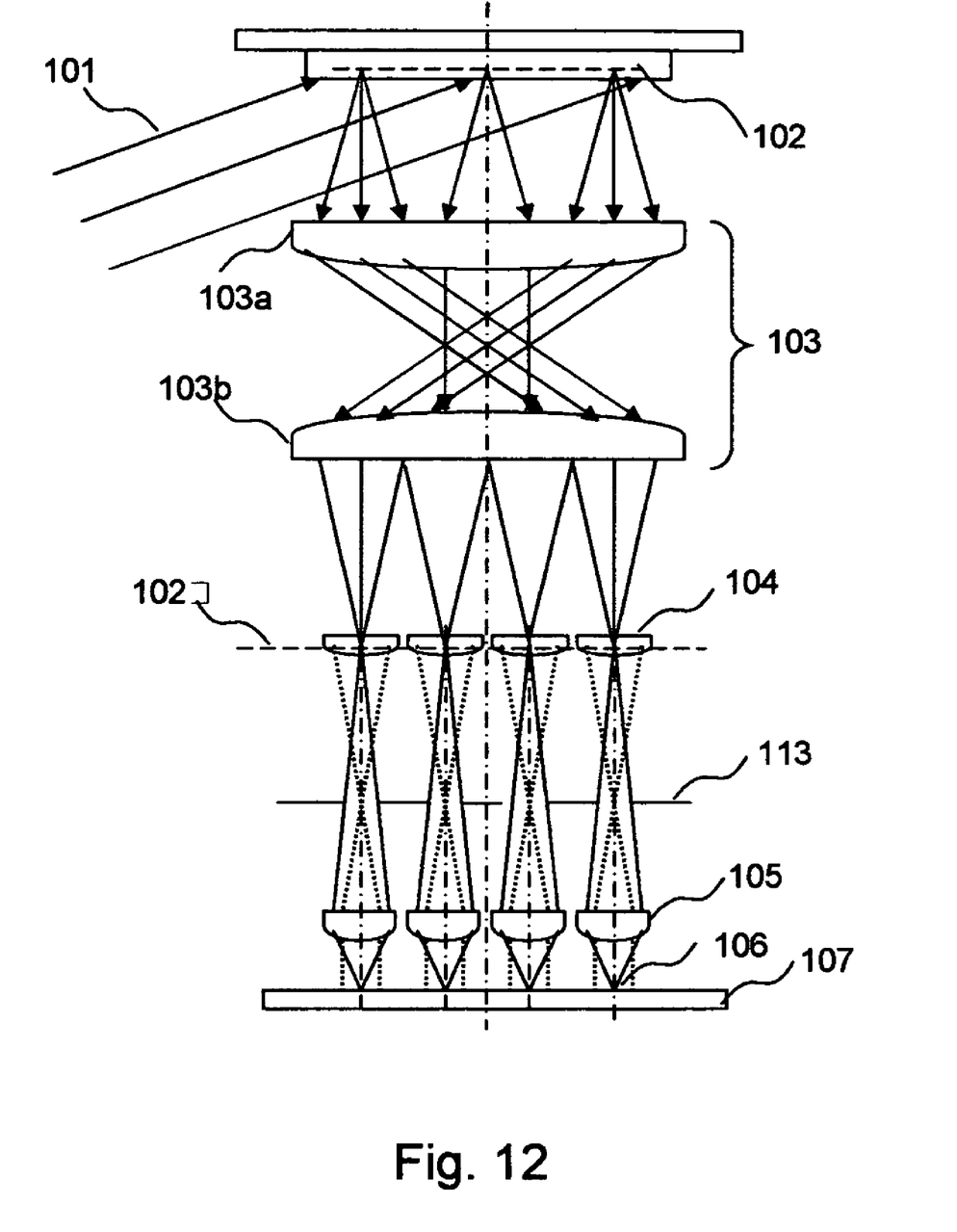
FIGS. 12~13 illustrate cross-sectional views of more embodiments of the divided sub-image array maskless photolithography system.

Referring now to FIG. 12, in an embodiment of the FIG. 11, the photolithography system in FIG. 11 utilizes an optical system 103 to image SLM 102 on the surface 102' of the field microlens 104 according to reduce optical aberrations. It is understood that the lens system 103 is adaptable to various components and requirements of the photolithography system, and one of ordinary skill in the art can select and position lenses appropriately. For the sake of example, a group of lenses 103a and an additional lens 103b are configured with the optic system 103. The optical system 103 is a telecentric optical system in general speaking.

Figure 13:
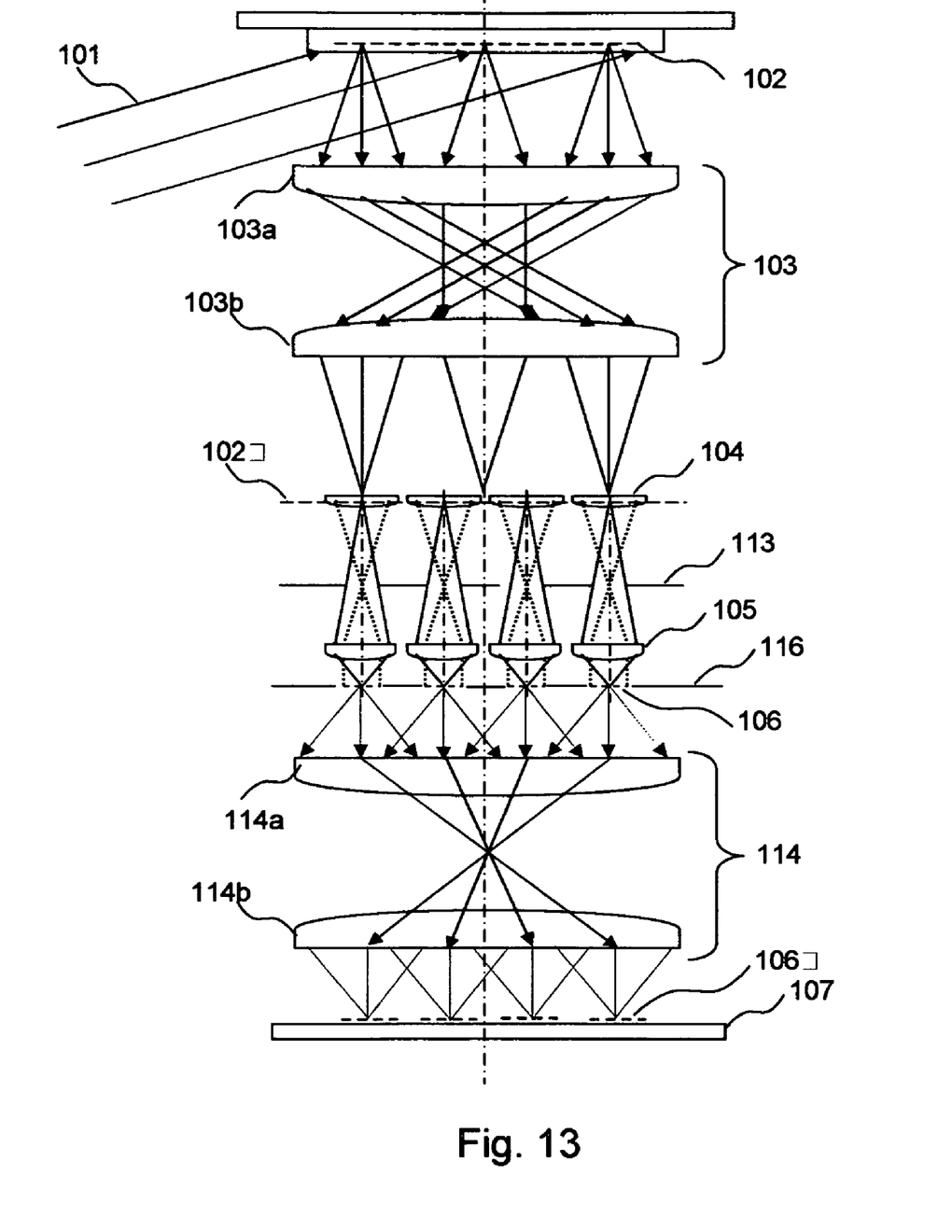

FIG. 13 illustrates a similar optic system 114 is placed between the image microlens array 105 and the stage 107. This optical system images the sub-image array 106 to surface 106' on stage 107. It increases system working distance which is the distance between last lens and stage because generally the distance of the sub-image 106 to image microlens array is too short for some of applications. Meantime it is possible to put a shadow mask 116 on the sub-image array surface 106 to reduce noise light because there are a lot of empty area between sub-images.

While the invention has been particularly shown and described with reference to the preferred embodiment thereof, it will be understood by those skilled in the art that various changes in form and detail may be made therein without departing form the spirit and scope of the invention, as set forth in the following claims.

What is claimed is:

1. A system for projecting a pixel-mask pattern onto a subject comprising:
a light source configured to project light onto a pixel panel;
the pixel panel configured to generate a pattern formed by a plurality of discrete pixels for projection onto the subject using a plurality of pixel elements, wherein the pixel elements are divided into at least first, second, third, and fourth sub-images of at least four pixels each, and wherein each of the first, second, third, and fourth sub-images is divided from the other sub-images on the pixel panel by a line of dummy pixel elements that is at least one pixel wide, wherein each dummy pixel element is dark in the generated pattern;
a first microlens array having at least first, second, third, and fourth microlenses positioned between the pixel panel and the subject, wherein the first microlens array is configured to receive the first, second, third, and fourth sub-images forming the pattern from the pixel panel and focus the first, second, third, and fourth sub-images on a focus plane that is located between the first microlens array and the subject, and wherein the at least four pixels of the first sub-image are received and focused by the first microlens, the at least four pixels of the second sub-image are received and focused by the second microlens, the at least four pixels of the third sub-image are received and focused by the third microlens, and the at least four pixels of the fourth sub-image are received and focused by the fourth microlens; and
a second microlens array having at least fifth, sixth, seventh, and eighth microlenses positioned between the focus plane and the subject, wherein the second microlens array is configured to condense the first, second, third, and fourth sub-images after the first, second, third, and fourth sub-images pass through the focus plane and project the condensed first, second, third, and fourth sub-images onto the subject, wherein the at least four pixels of the first sub-image are condensed and projected by the fifth microlens, the at least four pixels of the second sub-image are condensed and projected by the sixth microlens, the at least four pixels of the third sub-image are condensed and projected by the seventh microlens, and the at least four pixels of the fourth sub-image are condensed and projected by the eighth microlens, and wherein the second microlens array is configured to project each pixel of the first, second, third, and fourth sub-images onto the subject with a shape that identical to a shape of the corresponding pixel element used to generate the pixel.

2. The system of claim 1 further comprising an aperture array positioned at the focus plane.

3. The system of claim 1 further comprising a telecentric optical system positioned between the pixel panel and the first microlens array.

4. The system of claim 3 further comprising another telecentric optical system positioned between the second microlens array and the subject.

5. The system of claim 1 wherein at least the first and second sub-images are different in shape.

6. The system of claim 5 wherein the first sub-image is square in shape and wherein the second sub-image is circular in shape.

7. The system of claim 1 wherein the pixel panel is tilted at an angle relative to the subject to increase a resolution of the pixels on the subject.

8. The system of claim 1 further comprising a computer control system coupled to the pixel panel via at least one signal line, wherein the computer control system is configured to provide the pattern to the pixel panel via the at least one signal line.

9. The system of claim 8 wherein the computer control system is further configured to control movement of a stage on which the subject is positioned.

10. A system for projecting a pixel-mask pattern onto a subject comprising:
   a pixel pattern generator configured to generate a pattern formed by a plurality of discrete pixels for projection onto the subject using a plurality of pixel elements, wherein the pixel elements are divided into at least first and second sub-images of at least four pixels each, and wherein the first and second sub-images are divided from each other on the pixel pattern generator by a line of dummy pixel elements that is at least one pixel wide, wherein each dummy pixel element is dark in the generated pattern;
   a first microlens array having at least first and second microlenses positioned between the pixel pattern generator and the subject, wherein the first microlens array is configured to receive the first and second sub-images forming the pattern from the pixel pattern generator and focus the first and second sub-images on a focus plane that is located between the first microlens array and the subject, and wherein the at least four pixels of the first sub-image are received and focused by the first microlens and the at least four pixels of the second sub-image are received and focused by the second microlens; and
   a second microlens array having at least third and fourth microlenses positioned between the focus plane and the subject, wherein the second microlens array is configured to reduce the first and second sub-images after the first and second sub-images pass through the focus plane and project the reduced first and second sub-images onto the subject, wherein the at least four pixels of the first sub-image are reduced and projected by the third microlens and the at least four pixels of the second sub-image are reduced and projected by the fourth microlens, and wherein the second microlens array is configured to project each pixel of the first and second sub-images onto the subject to reproduce the first and second sub-images at a reduced size.

11. The system of claim 10 wherein the pixel pattern generator is a laser diode array.

12. The system of claim 10 wherein the pixel pattern generator is a light emitting diode array.

13. The system of claim 10 wherein the pixel pattern generator is a spatial light modulator and the system further comprises a light source configured to direct light towards the spatial light modulator.

14. The system of claim 10 further comprising a computer control system coupled to the pixel pattern generator via at least one signal line, wherein the computer control system is configured to provide the pattern to the pixel pattern generator via the at least one signal line.

15. The system of claim 14 wherein the computer control system is further configured to control movement of a stage on which the subject is positioned.

16. The system of claim 10 wherein the pixel panel is tilted at an angle relative to the subject to increase a resolution of the pixels on the subject.

17. The system of claim 10 wherein the first sub-image is vertically shifted by at least one pixel element on the pixel pattern generator relative to the second sub-image.

18. The system of claim 10 wherein the first sub-image is horizontally shifted by at least one pixel element on the pixel pattern generator relative to the second sub-image.

19. The system of claim 10 further comprising a plurality of sub-images in addition to the first and second sub-images, wherein each of the plurality of sub-images corresponds to a single microlens on each of the first and second microlens arrays.

20. A method for projecting a pixel-mask pattern onto a subject comprising:
   configuring, via a computer control system, a pixel panel to generate a pattern formed by a plurality of pixels for projection onto the subject using a plurality of pixel elements, wherein the pixel elements are divided into at least first and second sub-images of at least four pixels each, and wherein the first and second sub-images are divided from each other on the pixel panel by a line of dummy pixel elements that is at least one pixel wide, wherein each dummy pixel element is dark in the generated pattern;
   providing a first microlens array having at least first and second microlenses positioned between the pixel panel and the subject, wherein the first microlens array is configured to receive the first and second sub-images forming the pattern from the pixel panel and focus the first and second sub-images on a focus plane that is located between the first microlens array and the subject, and wherein the at least four pixels of the first sub-image are received and focused by the first microlens and the at least four pixels of the second sub-image are received and focused by the second microlens; and
   providing a second microlens array having at least third and fourth microlenses positioned between the focus plane and the subject, wherein the second microlens array is configured to reduce the first and second sub-images after the first and second sub-images pass through the focus plane and project the reduced first and second sub-images onto the subject, wherein the at least four pixels of the first sub-image are reduced and projected by the third microlens and the at least four pixels of the second sub-image are reduced and projected by the fourth microlens, and wherein the second microlens array is configured to project each pixel of the first and second sub-images onto the subject to reproduce the first and second sub-images at a reduced size.

* * * * *